(12) United States Patent
Zang et al.

(10) Patent No.: US 9,276,064 B1
(45) Date of Patent: Mar. 1, 2016

(54) FABRICATING STACKED NANOWIRE, FIELD-EFFECT TRANSISTORS

(71) Applicant: GLOBALFOUNDRIES INC., Grand Cayman (KY)

(72) Inventors: Hui Zang, Guilderland, NY (US); Guillaume Bouche, Albany, NY (US); Gabriel Padron Wells, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/535,433

(22) Filed: Nov. 7, 2014

(51) Int. Cl.
| | |
|---|---|
| *H01L 21/8238* | (2006.01) |
| *H01L 29/06* | (2006.01) |
| *H01L 29/66* | (2006.01) |
| *H01L 29/161* | (2006.01) |
| *H01L 29/16* | (2006.01) |
| *H01L 21/311* | (2006.01) |

(52) U.S. Cl.
CPC ...... *H01L 29/0673* (2013.01); *H01L 21/31144* (2013.01); *H01L 29/16* (2013.01); *H01L 29/161* (2013.01); *H01L 29/6656* (2013.01); *H01L 29/66795* (2013.01)

(58) Field of Classification Search
CPC ............... H01L 29/66795; H01L 29/6656; H01L 21/823468; H01L 21/02381; H01L 21/32139; H01L 29/16; H01L 21/31144; H01L 29/161; H01L 29/0673
USPC .................................. 438/230, 595, 396, 283
See application file for complete search history.

(56) References Cited

U.S. PATENT DOCUMENTS

2014/0001441 A1* 1/2014 Kim .................... H01L 29/0673
257/29

OTHER PUBLICATIONS

Guillaume Bouche et al., "Methods of Forming Nanowire Devices with Metal-Insulator-Semiconductor Source/Drain Contact and the Resulting Devices", U.S. Appl. No. 14/279,495, filed May 16, 2014 (31 pages).
Shao-Ming Koh et al., "Methods of Forming Nanowire Devices with Doped Extension Regions and the Resulting Devices", U.S. Appl. No. 14/308,138, filed Jun. 18, 2014 (42 pages).
Shao-Ming Koh et al., "Methods of Forming Nanowire Devices with Spacers and the Resulting Devices", U.S. Appl. No. 14/308,257, filed Jun. 18, 2014 (42 pages).

* cited by examiner

*Primary Examiner* — Thien F Tran
(74) *Attorney, Agent, or Firm* — Heslin Rothenberg Farley and Mesiti PC; Nicholas Mesiti

(57) ABSTRACT

Methods are presented for facilitating fabricating stacked nanowire, field-effect transistors. The methods include: forming a cut mask spacer on a gate structure disposed above multiple layers above a substrate structure, the gate structure including a sidewall spacer along its sidewalls, and the cut mask spacer overlying the sidewall spacer; defining a stack structure by cutting through the multiple layers using the cut mask spacer and gate structure as a mask, and selectively etching at least one layer of the multiple layers to undercut, in part, the mask, where at least one other layer of the multiple layers remains un-etched by the selectively etching; and providing an alignment mask spacer over the gate structure and over end surfaces of the multiple layers below the gate structure, the alignment mask spacer facilitating etching the other layer(s) of the multiple layers to selectively expose, in part, end surfaces of the other layer(s).

20 Claims, 8 Drawing Sheets

US 9,276,064 B1

FABRICATING STACKED NANOWIRE, FIELD-EFFECT TRANSISTORS

FIELD OF THE INVENTION

The present invention relates to integrated circuits, and more particularly, to methods of manufacturing integrated circuits, including semiconductor devices having one or more nanowires, and in particular, to methods of manufacturing stacked nanowire, field-effect transistors.

BACKGROUND OF THE INVENTION

Complementary metal oxide semiconductor (CMOS) technology is the primary technology employed for ultra-large scale integrated (ULSI) circuits. Over the past decades, reduction in the size of CMOS transistors has been a principle focus of the microelectronics industry.

Transistors, such as metal oxide semiconductor field-effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as MOSFETs, are built on top of the surface of a bulk substrate. The substrate is doped to form source and drain regions, and the conductive layer is provided between the source and drain regions. The conductive layer operates as a gate for the transistor, and the gate controls current in a channel between the source and the drain regions. As transistors become smaller, the body thickness of the transistor (or thickness of the depletion layer below the inversion channel) must be scaled down to achieve superior short-channel performance.

As an enhancement on conventional, planar transistor structures, three-dimensional (3D) transistor devices are under development, including FinFET devices and nanowire devices. In a FinFET, a generally vertically-positioned, fin-shaped active area is formed, and a gate electrode encloses both the sides and upper surface of the fin-shaped active area to form a tri-gate structure.

In a nanowire structure or device, a nanowire is formed for the channel region of the device. Such nanowire devices offer one possible solution to the continuing demand for semiconductor devices with smaller feature sizes. However, enhancements to manufacturing techniques for nanowire devices are needed.

BRIEF SUMMARY

Various shortcomings of the prior art are overcome, and additional advantages are provided through the provision, in one aspect, of a method which includes: forming a cut mask spacer on a gate structure disposed above multiple layers above a substrate structure, the gate structure including a sidewall spacer along sidewalls thereof, and the cut mask spacer overlying the sidewall spacer; defining a stack structure by cutting through the multiple layers using the cut mask spacer and gate structure as a mask, and selectively etching at least one layer of the multiple layers to undercut, in part, the mask, where at least one other layer of the multiple layers remains un-etched by the selectively etching; and providing an alignment mask spacer over the gate structure and over end surfaces of the multiple layers below the gate structure, the alignment mask spacer facilitating etching the at least one other layer of the multiple layers to selectively expose the end surfaces thereof.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Disclosed herein, at least in part, are methods of facilitating fabrication of a semiconductor device having one or more nanowires. As used herein, a nanowire is an elongate nanostructure with, for instance, a characteristic dimension or diameter on the order of a few nanometers or less. Alternatively, a nanowire can be defined as an elongate structure having a thickness or diameter constrained to, for instance, ten nanometers or less, and a greater or unconstrained length. By way of example, semiconductor devices are discussed herein using stacked semiconducting nanowires. In one embodiment, the nanowires are incorporated into transistors, such as metal oxide semiconductor field-effect transistors (MOSFETs). Advantageously, the processes disclosed herein are compatible with complementary metal oxide semiconductor (CMOS) processing.

A nanowire field-effect transistor is of significant interest in the semiconductor fabrication industry due to its excellent gate controllability on the channel, and minimized short channel effect. However, fabrication of nanowire transistors can be challenging. For instance, current density within a given footprint of a wafer may be adversely affected by fabricating single-nanowire-based, field-effect transistors. This issue can be addressed by providing stacked nanowires, that is, two or more substantially-vertically-aligned nanowires, as part of a stacked nanowire, field-effect transistor.

Reference is made below to the drawings, which are not drawn to scale for ease of understanding, wherein the same reference numbers used throughout different figures designate the same or similar components.

FIGS. 1A-1E depict one embodiment of a process for facilitating forming semiconductor structures having stacked nanowires.

Figure 1A:
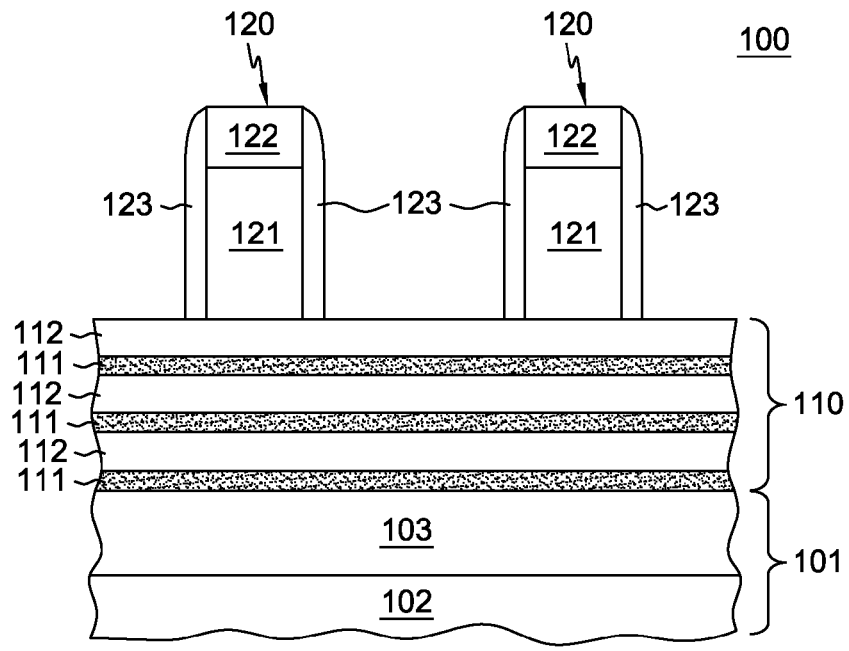
FIGS. 1A-1E depict one embodiment of a method of fabricating a semiconductor structure including stacked nanowires, in accordance with one or more aspects of the present invention.

Referring initially to FIG. 1A, a semiconductor structure, generally denoted 100, is depicted at an intermediate semiconductor fabrication stage. Semiconductor structure 100 includes a substrate structure 101 and multiple layers 110 disposed above substrate structure 101. Substrate structure 101 may be formed as any of a variety of substrate structures. By way of example only, substrate structure 101 is depicted in FIGS. 1A-1E as including a bulk semiconductor substrate 102, such as a silicon substrate, with an insulator layer 103 disposed over bulk semiconductor substrate 102. Insulator layer 103 may include any of a variety of insulating layers, including an oxide layer, with the depicted semiconductor structure 100 being an example of a semiconductor-on-insulator structure.

By way of further example, substrate structure 101 could be or include a bulk semiconductor material such as, for example, a bulk silicon wafer. In another embodiment, substrate structure 101 may be any silicon-containing substrate including, but not limited to, a substrate fabricated of or including silicon (Si), single crystal silicon, polycrystalline Si, amorphous Si, silicon-on-nothing (SON), or silicon-on-replacement insulator (SRI) or the like. Substrate structure 101 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

In the depicted implementation, the multiple layers 110 include multiple alternating layers of a first material layer 111 and a second material layer 112. In one implementation, the first material layer and the second material layer are each semiconductor material layers, such as layers of silicon and silicon-germanium, respectively.

In one example, first material layer 111 may be deposited using processes such as chemical-vapor deposition (CVD) or molecular beam epitaxy (MBE), and have a thickness of about 2 nm to 100 nm, by way of example only. In a specific example, the thickness of first material layer 111 may be between, for instance, 10 nm and 20 nm, and the first material layer, such as a layer of silicon, may be grown by flowing over the structure a reactant gas, such as dichlorosilane ($SiH_2Cl_2$), trichlorosilane ($SiHCl_3$). silicontetrachloride ($SiCl_4$), or silane ($SiH_4$), together with a carrier gas such as hydrogen gas, to form a uniform silicon first material layer.

By way of example, second material layer 112 may be epitaxially-grown or deposited over first material layer 111, and may be (for instance) an expitaxial, single-crystalline semiconductor layer. For example, second material layer 112 may be or include a layer of silicon germanium, which may be expressed as $Si_{1-x}Ge_x$ wherein x, the atomic ratio of germanium in silicon, may be less than or substantially equal to about 1, although the atomic ratio is about 0.3 to about 0.7 in one example. As a specific example, the atomic ratio of germanium present in the layer of silicon germanium may be about 0.5. Silicon germanium second material layer 112, may be formed (for example) by various epitaxial growth processes such as ultra-high vacuum chemical vapor deposition (UHV-CVD), low-pressure CVD (LPCVD), reduced-pressure CVD (RPCVD), rapid thermal CVD (RTCVD), or molecular beam epitaxy (MBE). In one example, the CVD-based epitaxial growth may take place at a temperature of between about 600° C. to about 1100° C., while the MBE may typically use a lower temperature. In a specific example, the selective epitaxial growth of the silicon germanium layer may be performed using halogermanes and silanes as the source gases at temperatures below 600° C. A silicon germanium second material 112 may have a thickness of between about 5 to 100 nanometers, depending on the metastable thickness of the $Si_{1-x}Ge_x$ layer.

The above-noted sample processes for forming the first material layer 111 and second material layer 112 may be alternately performed any number of times in order to achieve the desired number of alternating layers in the multiple layers 110 disposed above substrate structure 101. In one implementation, the thickness of the second material layers 112 may be greater than the thickness of the first material layers, as depicted.

One or more gate structures 120 may be provided above multiple layers 110 disposed over substrate structure 101. Gate structures 120 may include a variety of different materials in a variety of configurations, depending (for instance) whether gate-first or gate-last processing is employed. In the example depicted, gate structures 120 include a gate material(s) 121 with a protective layer 122 disposed over gate material(s) 121. In one embodiment, the gate material(s) may be or include polysilicon, and the protective layer 122 may be or include a nitride material, or a low-k or ultra-low-k dielectric material. By way of example, the low-k dielectric material may have a dielectric constant below 3.3, for instance, about 2.7, and the ultra-low-k dielectric material may have a dielectric constant of, for instance, 2.5 or below. In the embodiment depicted, sidewall spacers 123 are also formed along the sidewalls of the gate material(s) 121 and protective layer 122. Sidewall spacers 123 may be formed by conformally depositing a layer of spacer material, such as silicon-nitride, and then anisotropically etching the structure to define the sidewall spacers 123, as illustrated.

Figure 1B:
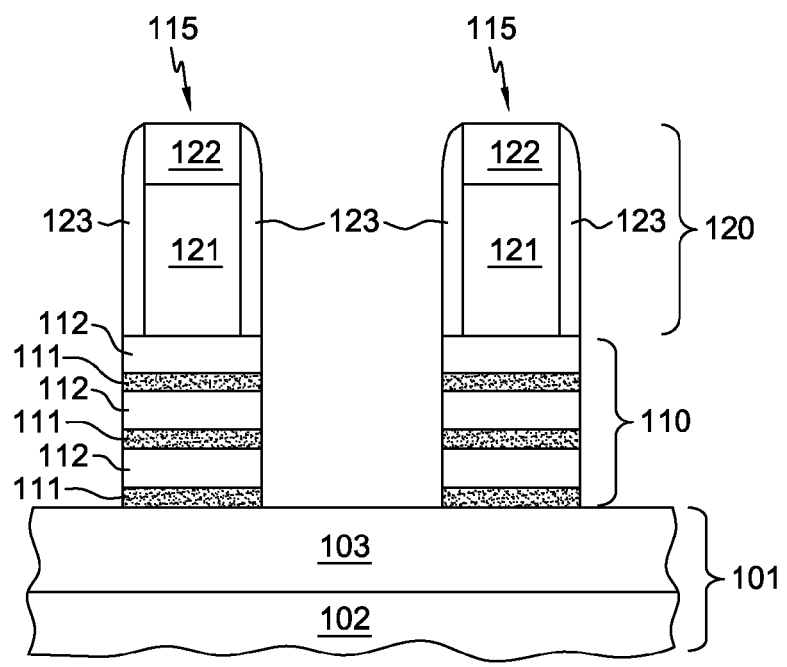

As depicted in FIG. 1B, one or more stack structures 115 are defined from the multiple layers 110 and gate structures 120 using lithography and etching processes. Thus, in one implementation, stack structures 115 (or fins) include alternating layers of first material layer 111 and second material layer 112. As a specific example, the stack structures may be configured and sized as a pattern of fins extending above substrate structure 101. For instance, the stack structures 115 could replace conventional fins and facilitate the fabrication of fin-type devices, such as fin-based, multi-gate transistor architectures.

By way of example, formation of stack structures 115 may be achieved by cutting or etching through multiple layers 110 using gate structures 120 as a mask, so that the resulting stack structures self-align to the gate structures, and in particular, to the sidewall spacers 123 of gate structures 120. The etching may be performed, for example, by any suitable etching process, such as by an anisotropic dry etching process, for instance, reactive-ion-etching (RIE) in sulfur hexafluoride ($SF_6$).

Figure 1C:
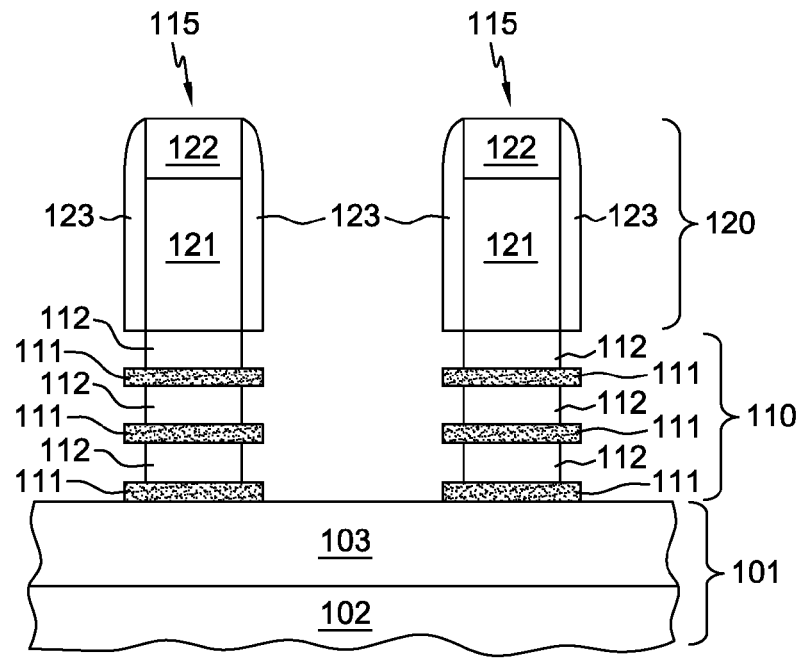

As illustrated in FIG. 1C, the second material layers 112 are subsequently selectively etched to undercut gate structures 120 so that the end surfaces of first material layers 111 extend past the etched end surfaces of second material layers 112. The selective recessing of second material layers 112 may be performed by one skilled in the art using one or more appropriately selective etch processes. For instance, corresponding etch protocol may be implemented by way of $SF_6/Ar/O_2/CH_2F_2$ pulsed RIE discharges, where chemical breakup within bulk plasma discharge, as well as the flux of radical/energized species reaching the wafer surface, can be reliably controlled. This technique can provide ample selectivity margin to drive undercut etch process, achieving selectivity ratios of, for instance, 10:3:1 (or higher), for low-k/nitride: Si:SiGe, respectively.

Figure 1D:
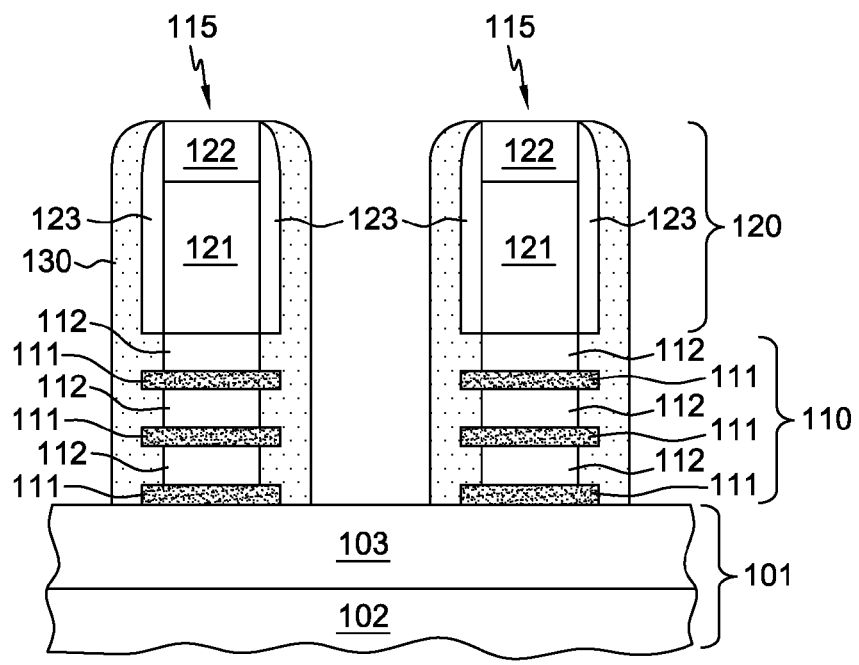

Referring to FIG. 1D, a layer of protective material is conformally deposited over substrate structure 101 and stack structures 115, and anisotropically etched to form protective spacers 130, as illustrated. In various embodiments, protective spacers 130 may be formed of a low-k material (for instance, having a dielectric constant value of 3.3 or less), a nitride, an oxide, or a silicon oxy-carbide material. The thickness of the layer can be readily controlled, and depends upon the desired application. As illustrated, protective spacer 130 is deposited to, in one embodiment, overfill the undercut cavities created by the previous recessing of the second material layers 112. Next, a time-controlled, isotropic reactive ion etching (RIE) is performed to, in part, remove the protective spacers 130 from sidewall spacers 123 of gate structure 120, and expose end surfaces of first material layers 111, with the resultant structure being depicted in FIG. 1E. As illustrated, only portions of the protective spacer 130 remain adjacent to the recessed, shortened second material layers 112. Subsequently, raised epitaxial (epi) source/drain regions 140 may be formed for the device using known epitaxial deposition processing. The source/drain regions 140 may be grown, at least in part, from the exposed end surfaces of the first material layers 111. Also, note that in this embodiment, the first material layers become the nanowires for the nanowire structures being fabricated.

Figure 1E:
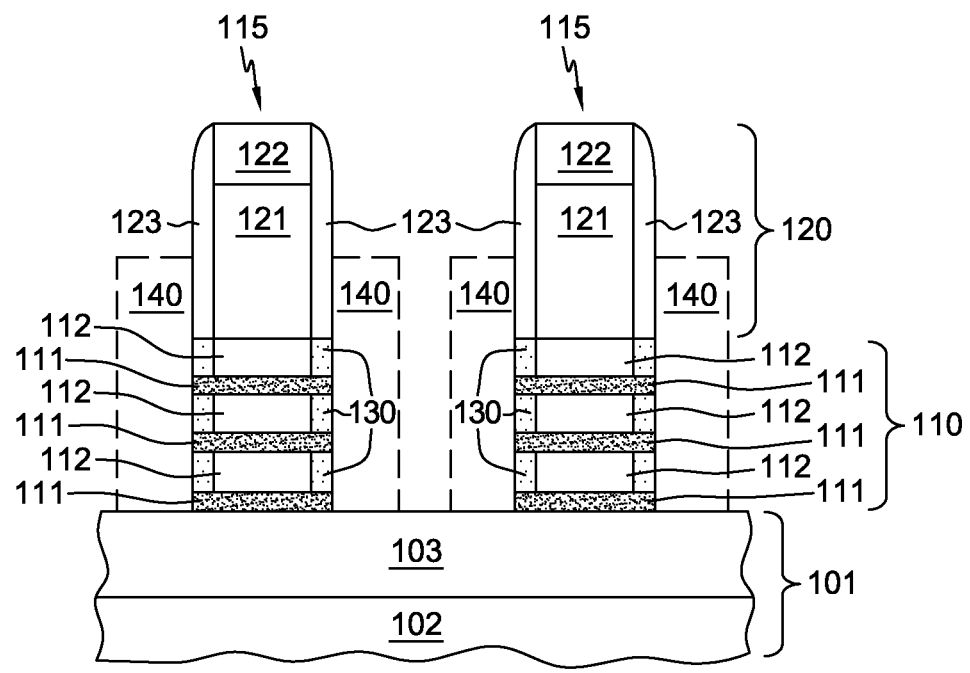

One issue with the above-described approach of FIGS. 1A-1E is the time-controlled isotropic reactive ion-etch used to form the structure of FIG. 1E from that of FIG. 1D. By removing this isotropic etch, fabrication enhancements can be provided, including improvements in the process window and process uniformity for producing the nanowire semiconductor structure(s). For instance, employing an anisotropic etch in place of the time-controlled isotropic etch of the above-described processing of FIGS. 1D & 1E provides end point control of the etch process, and thereby improves process window and process uniformities. The endpoint controls may be obtained from reliable signal measurements, incorporating a single method or combination of methods, involving direct optical emission signals collected from the plasma gas phase, residual gas analyzer (RGA) signals from chemical byproduct generation, and/or current sensing signals collected from conductive interfaces directly in contact with the plasma/wafer processing system.

Generally stated, disclosed herein is a method for fabricating a semiconductor structure which includes one or more nanowires, including stacked nanowires. The method includes, for instance: forming a cut mask spacer on a gate structure disposed above multiple layers above a substrate structure, the gate structure having a sidewall spacer along sidewalls thereof, and the cut mask spacer overlying the sidewall spacer; defining a stack structure by cutting through the multiple layers using the cut mask spacer and gate structure as a mask, and selectively etching at least one layer of the multiple layers to undercut, in part, the mask, where at least one other layer of the multiple layers remains un-etched by the selectively etching; and providing an alignment mask spacer on the gate structure and over end surfaces of the multiple layers below the gate structure, the alignment mask spacer facilitating etching the at least one other layer of the multiple layers to selectively expose the end surfaces thereof.

In one implementation, the methods further include anisotropically etching the alignment mask spacer and the at least one other layer of the multiple layers to expose, in part, the at least one other layer of the multiple layers, and if desired, to align the at least one other layer of the multiple layers to the alignment mask spacer on the gate structure. In one embodiment, the selectively etching of the at least one layer of the multiple layers partially undercuts the gates structure.

In certain implementations, the cut mask spacer has a greater thickness on the sidewall spacer of the gate structure than a thickness of the alignment mask spacer on the sidewall spacer of the gate structure. In one embodiment, the method further includes removing the cut mask spacer from over the gate structure prior to providing of the alignment mask spacer.

Note that after the cutting and the selectively etching steps, the at least one layer of the multiple layers partially undercuts the gate structure, and at least one other layer of the multiple layers extends laterally out past the gate structure. In one embodiment, the multiple layers include a first semiconductor material layer and a second semiconductor material layer, and the at least one layer of the multiple layers selectively etched includes the second semiconductor material layer, and the at least one other layer of the multiple layers includes the first semiconductor material layer. As one example, the first semiconductor material layer may be silicon, and the second semiconductor material layer may be germanium or silicon-germanium.

In certain embodiments, the multiple layers include multiple alternating first and second semiconductor material layers. For instance, the multiple second semiconductor material layers may include the at least one layer of the multiple layers, wherein (for instance) the second material layers are formed of germanium or silicon-germanium. Further, the multiple first semiconductor material layers may include the at least one other layer of the multiple layers, with the first semiconductor material layers including, for example, silicon. In one implementation, the second semiconductor material layers in the multiple-layer stack may have a greater thickness than the first semiconductor material layers. Further, providing the alignment mask spacer may include conformally wrapping the alignment mask spacer around exposed portions of the first semiconductor material layers of the alternating first and second semiconductor material layers.

As further detailed examples, the cut mask spacer may include an oxide spacer, and the alignment spacer may include a nitride spacer. Further, the sidewall spacer of the gate structures may be one of a nitride spacer or a low-k dielectric constant spacer. In one implementation, the substrate structure includes an insulating layer disposed over a substrate, with the multiple layers in the gate structure being disposed above the insulating layer.

Figure 2A:
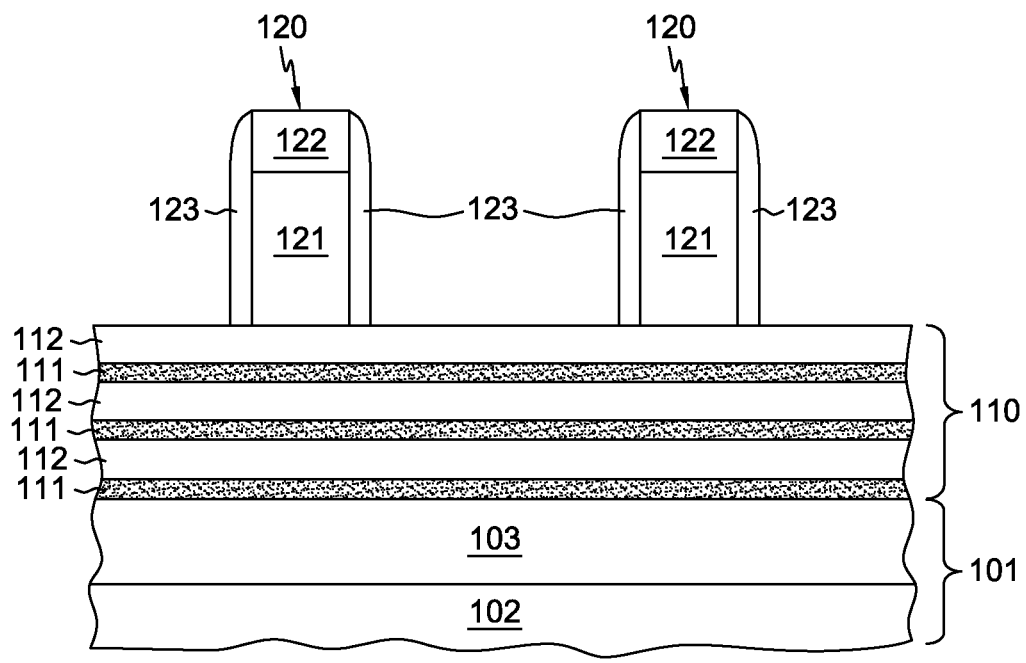
FIGS. 2A-2H depict another embodiment of a process of fabricating a semiconductor structure including one or more nanowires, in accordance with one or more aspects of the present invention.

By way of detailed example, FIGS. 2A-2H depict another embodiment of a process of fabricating semiconductor structures, and in particular, semiconductor structures including stacked nanowires, such as stacked nanowire, field-effect transistors. As illustrated, the intermediate semiconductor structure 100 of FIG. 2A is substantially identical to that of FIG. 1A, described above.

Figure 2B:
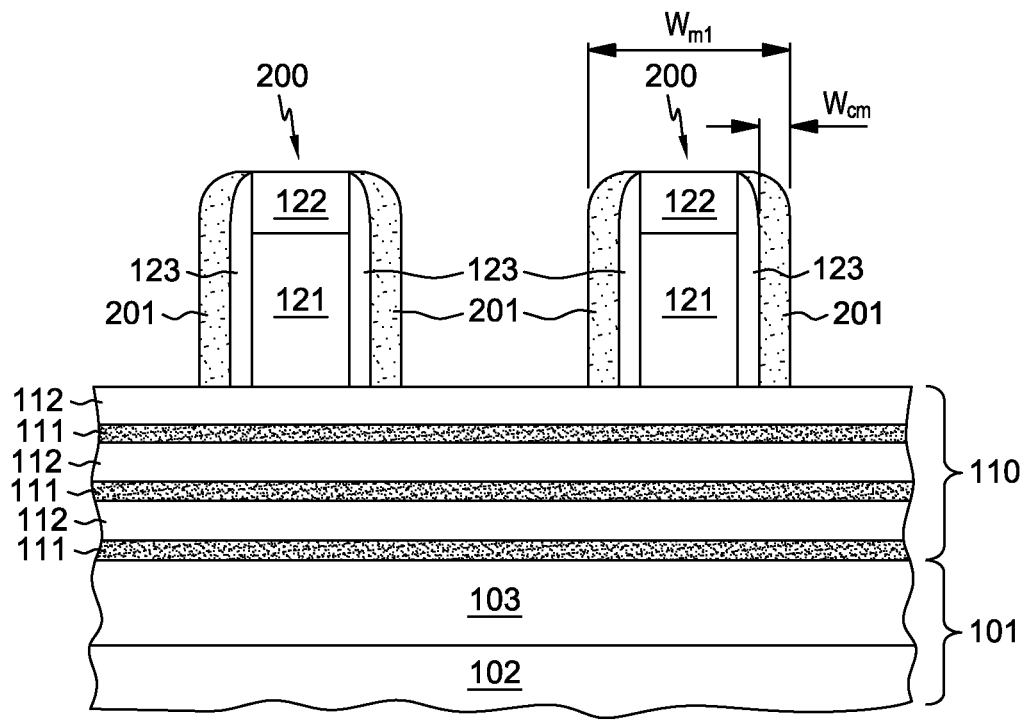

In FIG. 2B, a cut mask spacer 201 is provided on the sidewall spacers 123 of gate structures 120 to produce masks or masking structures 200 from the gate structures 120 and cut mask spacers 201. As illustrated, masking structures 200 have a width $W_{m1}$ that is greater than that of gate structures 120 by twice the width $W_{cm}$ of cut mask spacers 201. As one example, cut mask spacers 201 may be formed by conformally depositing a layer of cut mask spacer material, such as an oxide material, and then anisotropically etching the structure to define cut mask spacers 201, as illustrated. In one example, the width of cut mask spacers 201 may be larger than the width of sidewall spacers 123 of gate structures 120.

Figure 2C:
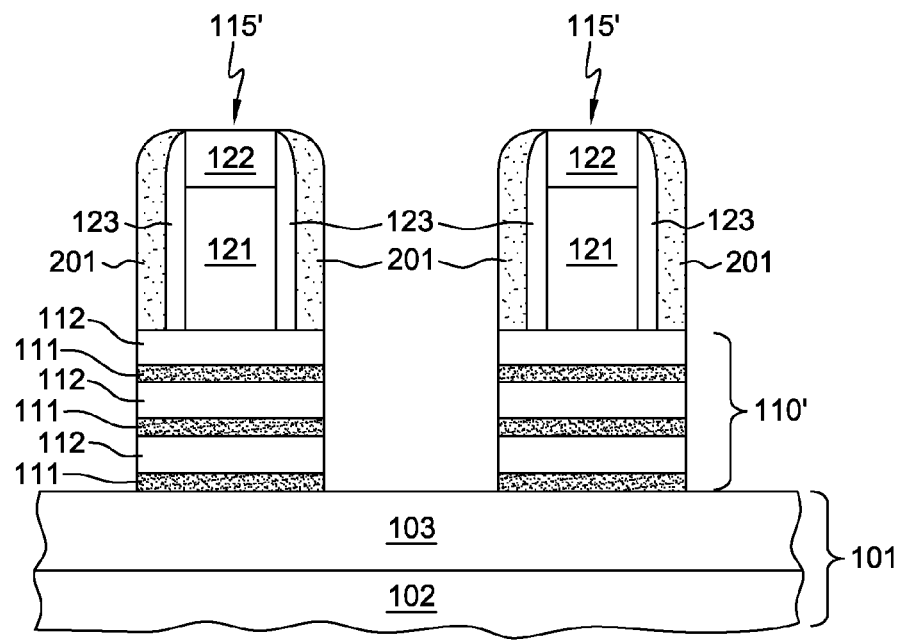

As depicted in FIG. 2C, one or more stack structures 115' are defined from the multiple layers 110 and gate structures 120 using lithography and etching processes. As noted above, in one implementation, stack structures 115' include alternating layers of first material layer 111 and second material layer 112. As a specific example, the stack structures may be configured and sized as a pattern of fins extending above substrate structure 101. For instance, the stack structures 115' could replace conventional fins and facilitate the fabrication of fin-type nanowire devices, such as nanowire-based, FinFETs. Note that in comparison to the process flow of FIGS. 1A-1E, the stack structures 115' of FIG. 2C are slightly wider than those of FIG. 1B by twice the width $W_{cm}$ of cut mask spacer 201.

Figure 2D:
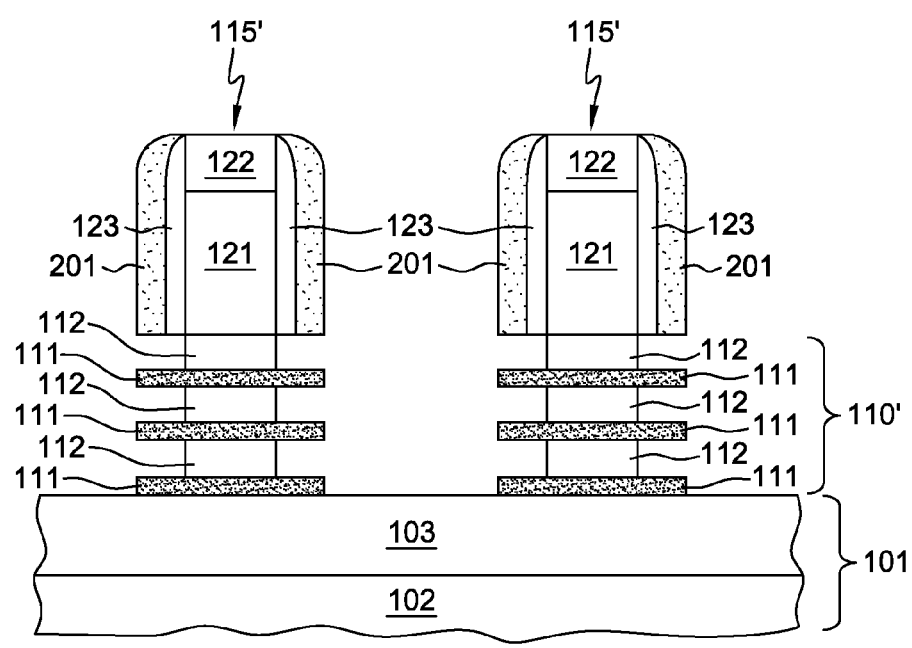

After cutting the nanowires, second material layers 112 may be selectively etched to undercut masking structures 200 so that the end surfaces of first material layers 111 extend past the etched end surfaces of second material layers 112, as illustrated in FIG. 2D. The selective recessing of second material layers 112 may be performed by one skilled in the art using one or more appropriately selected etch processes dependent, for instance, on the semiconductor materials of first material layer 111 and second material layer 112. This selective etching is a timed-etch, defined by the desired amount of undercutting of the masking structure 200, and/or gate structure 120.

Figure 2E:
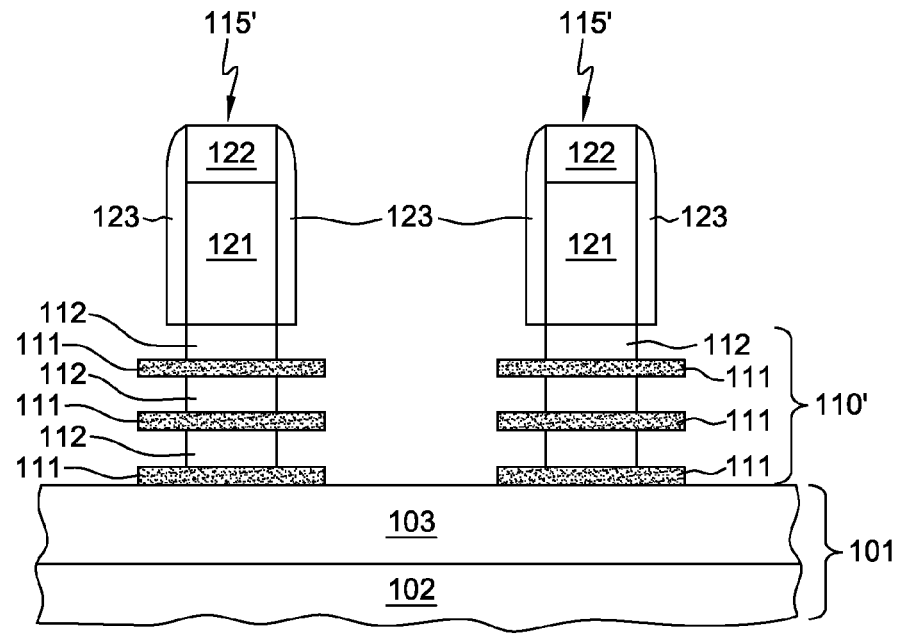

As illustrated in FIG. 2E, cut mask spacer 201 (see FIG. 2D) is removed from over the gate structure, and in particular, from over the sidewall spacers 123 of gate structure 120. In the case where the cut mask spacer is or includes an oxide, this may be accomplished in a single-diluted hydro-fluoric acid (DHF) removal process.

Figure 2F:
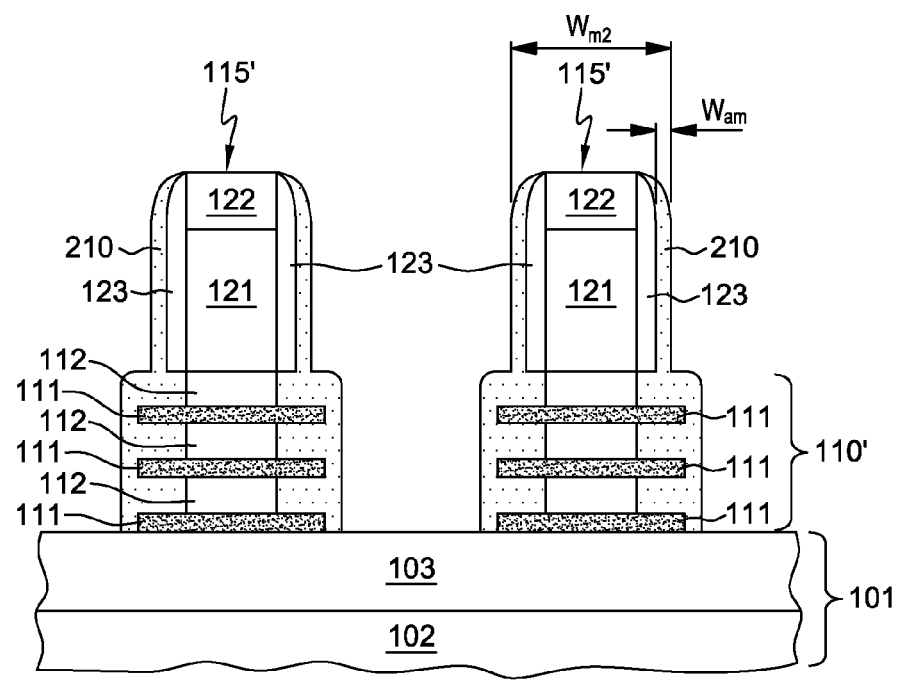

Next, as illustrated in FIG. 2F, an alignment mask spacer 210 is deposited conformally over the stack structures 115'. In one embodiment, the alignment mask structure 210 covers sidewall spacers 123 of gate structures 120, and has a thickness $W_{am}$ that is less than the thickness ($W_{cm}$) of the cut mask spacers described above. The result is that the width ($W_{m2}$) of the gate structure 120 and alignment mask spacer 210 is less than the width ($W_{m1}$) of the gate structure, plus cut mask spacer 201, described above. As one example, the alignment mask spacer 210 may be formed of a low-k dielectric material, or a nitride material, such as silicon nitride. By way of example, a silicon nitride alignment mask could be deposited using, for instance, the tool model "iRAD" commercially available from Tokyo Electron, Ltd. (TEL). By way of specific example, silicon nitride deposition may be performed at 500° C., with silicon nitride being deposited by exposing the structure to alternating flows of dichlorosilane (DCS) and ammonia, plus RF power. Typical conditions are 1 slm of DCS and 5 slm of $NH_3$, with 100 W of RF power. The thickness of the alignment mask spacer may be determined by controlling, for instance, the number of cycles (i.e., number of thin films deposited). As illustrated in FIG. 2F, in one embodiment, this process results in filling the undercut space below gate structures 120 and covering the end surfaces of first semiconductor material layers 111.

As one specific example, the first semiconductor material layers 111 may have a thickness of about 10-12 nm, and be fabricated of silicon, the second material layers may have a thickness of about 10-30 nm, and be fabricated of silicon-germanium, and the alignment mask spacer 210 may have a thickness of about 5-10 nm, and be fabricated of silicon nitride.

Figure 2G:
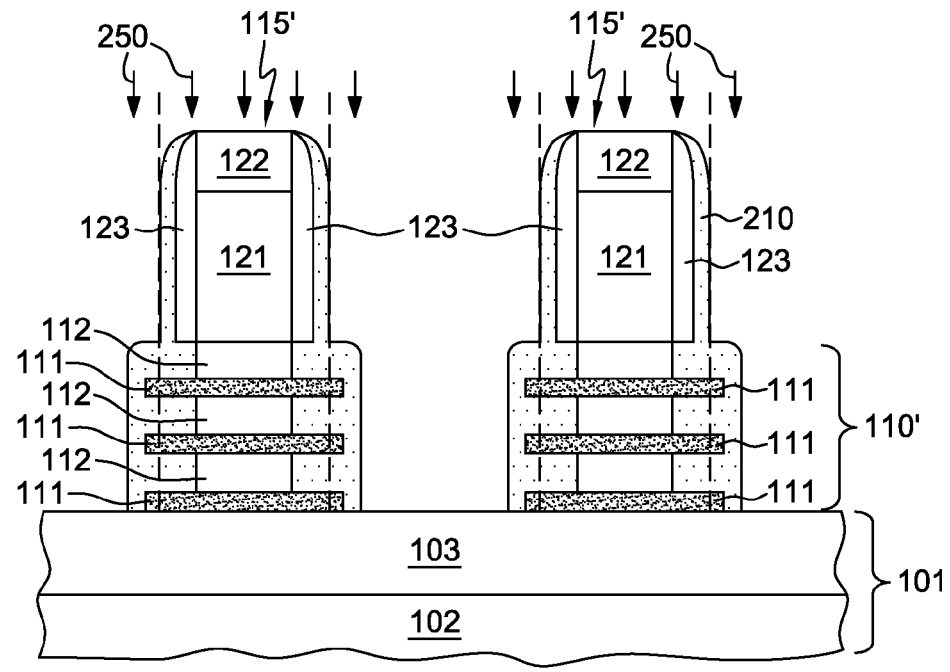

Next, an anisotropic etch 250 is advantageously employed, as illustrated in FIG. 2G, to etch the alignment mask spacer 210, at least in part, from the sidewall spacers 123 of the gate structures, and to expose end surfaces of the first semiconductor material layers 111 in the stack structures 115'. By way of example, this anisotropic etch is a vertical etch of the stack structures using, for instance, $SO_2/CHF_3/Ar/He$, with bias power added to the source platform. $CF_4$ may be added to the gas mixture to modulate selectivity margin over the low-k or oxide boundaries, with more $CF_4$ reducing overall selectivity factor over the interface materials. Industrial plasma reactors incorporating ICP or microwave sources can function to drive the corresponding etch protocol. Furthermore, to increase etch anisotropic factor and avoid undesired erosion of gate structure, gas flow modulation, as well as bias pulsing can be incorporated in the process to maximize control over sidewall passivation (SWP) dynamics and selectivity factors over the various materials/interfaces involved. This mixed gas/bias pulsing technique balances directed ion-flux/ion-energy to total flux of passivating species reaching the wafer surface to controllably drive the anisotropic etch step.

Figure 2H:
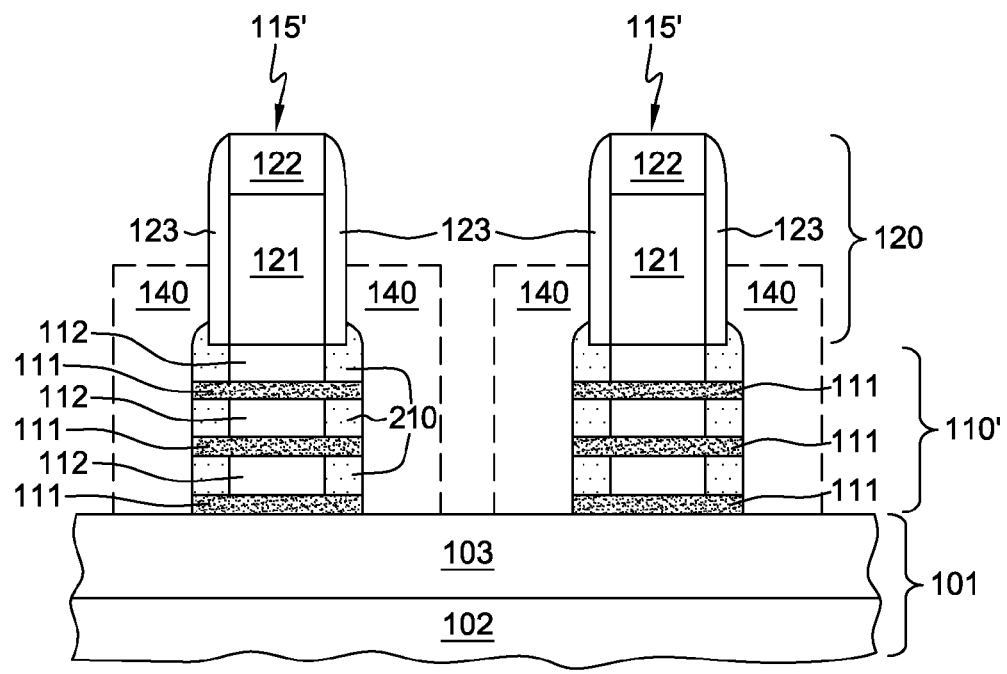

One embodiment of the resultant structure is depicted in FIG. 2H. As described above, raised epitaxial source/drain regions 140 may be formed for the device by performing epitaxial deposition processing. These source/drain regions 140 may be grown, at least in part, from the exposed end surfaces of first semiconductor material layers 111.

Advantageously, the processing of FIGS. 2A-2H provides better process window control, uniformity, and repeatability, compared to the time-controlled, isotropic etch-dependent processing of FIGS. 1D-1E, described above. The process of FIGS. 2A-2H advantageously employs spacer thicknesses in the process, which are easy to control using existing processing. Further, the processing of FIGS. 2A-2H results in etching vertically-anisotropically, rather than laterally-isotropically. Still further, the processing of FIGS. 2A-2H is compatible with different thicknesses of the second material layer, that is, different thicknesses of silicon-germanium layers, which is a better process window for certain semiconductor fabrication processes, such as for replacement metal gate processes. One embodiment of this is depicted in FIGS. 3A & 3B.

Figure 3A:
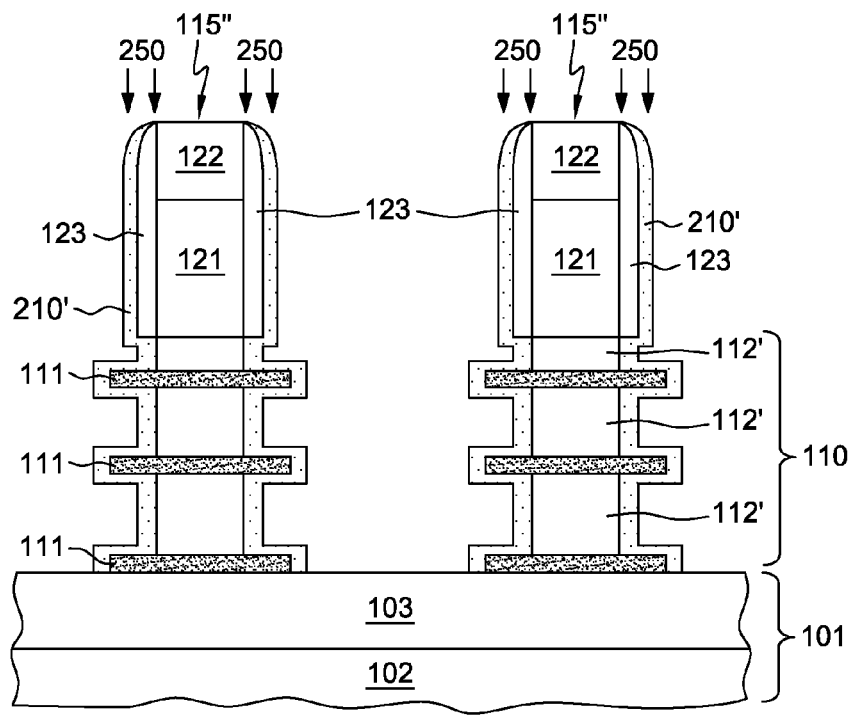
FIGS. 3A & 3B depict a further embodiment of a process of fabricating a semiconductor structure having one or more nanowires, similar to the processing of FIGS. 2A-2H, but with the spacing greater between adjacent nanowires, in accordance with one or more aspects of the present invention.
Figure 3B:
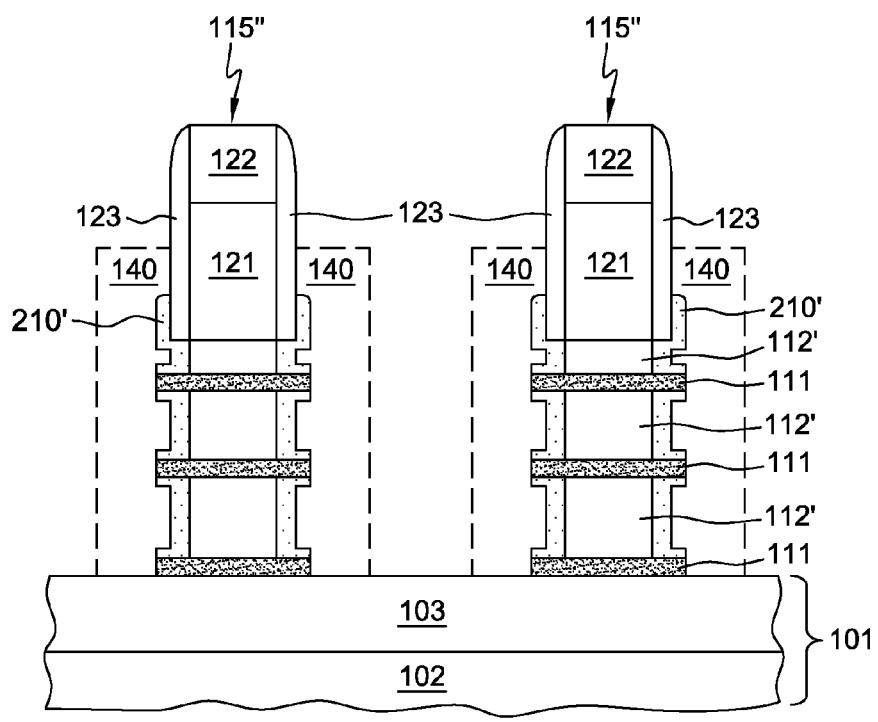

Referring to FIG. 3A, stack structures 115" are illustrated with a conformally-applied alignment mask spacer 210' disposed over the stack structures. As illustrated, one or more of the second material layers 112' in the alternating first and second semiconductor material layers of the stack structure are thicker, for instance, thicker than the first semiconductor material layers, or even thicker than other second semiconductor material layers 112' in the stack. Thus, in this example, the alignment mask spacer 210' does not completely fill the undercut recesses between the laterally-projecting, first semiconductor material layers 111. After the anisotropic etch 250, a structure such as depicted in FIG. 3B may be obtained. As described above, anisotropic etch 250 is a vertical etch of the stack structures, and in particular, of the alignment mask spacers 210' and first semiconductor material layers 111. Since the thickness of the alignment mask spacer 210' is less than the thickness of the cut mask spacer employed to cut the multiple layers, end surfaces of the first semiconductor material 111 are exposed by this anisotropic etching, without the need to perform a time-controlled, isotropic etch, as in the case of the process of FIGS. 1A-1E. Note that the processing of FIGS. 2A-3B may be employed with various combinations of thicknesses of the first and second semiconductor material layers. Since the first semiconductor material layers 111 are to form the nanowires, then the thicknesses of the second semiconductor material layers operate, in part, to define the spacing between the resultant nanowires of the stacked nanowire semiconductor device being formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    forming a cut mask spacer on a gate structure disposed above multiple layers above a substrate structure, the gate structure including a sidewall spacer along sidewalls thereof, and the cut mask spacer overlying the sidewall spacer;
    defining a stack structure by cutting through the multiple layers using the cut mask spacer and the gate structure as a mask, and selectively etching at least one layer of the multiple layers to undercut, in part, the mask, where at least one other layer of the multiple layers remains unetched by the selectively etching; and
    providing an alignment mask spacer over the gate structure and over end surfaces of the multiple layers below the gate structure, the alignment mask spacer facilitating etching the at least one other layer of the multiple layers to selectively expose the end surfaces thereof.

2. The method of claim 1, further comprising anisotropically etching the alignment mask spacer and the at least one other layer of the multiple layers to expose, in part, the at least one other layer of the multiple layers.

3. The method of claim 2, wherein the anisotropically etching the alignment mask spacer further aligns the at least one other layer of the multiple layers to the alignment mask spacer on the gate structure.

4. The method of claim 1, wherein the selectively etching the at least one layer of the multiple layers partially undercuts the gate structure.

5. The method of claim 1, wherein the cut mask spacer has a greater thickness on the sidewall spacer of the gate structure than a thickness of the alignment mask spacer on the sidewall spacer of the gate structure.

6. The method of claim 1, further comprising removing the cut mask spacer from the gate structure prior to providing the alignment mask spacer.

7. The method of claim 6, wherein the cut mask spacer has a greater thickness on the sidewall spacer of the gate structure than a thickness of the alignment mask spacer on the sidewall spacer of the gate structure.

8. The method of claim 1, wherein after the cutting and the selectively etching, the at least one layer of the multiple layers partially undercuts the gate structure, and the at least one other layer of the multiple layers extends laterally out past the gate structure.

9. The method of claim 1, wherein the multiple layers comprise a first semiconductor material layer and a second semiconductor material layer, wherein the at least one layer of the multiple layers selectively etched comprises the second semiconductor material layer, and the at least one other layer of the multiple layers comprises the first semiconductor material layer.

10. The method of claim 9, wherein the first semiconductor material layer comprises silicon, and the second semiconductor material layer comprises germanium or silicon-germanium.

11. The method of claim 1, wherein the multiple layers comprise multiple, alternating first and second semiconductor material layers.

12. The method of claim 11, wherein the multiple second semiconductor material layers comprise the at least one layer of the multiple layers.

13. The method of claim 12, wherein the multiple second semiconductor material layers comprise germanium or silicon-germanium.

14. The method of claim 11, wherein the multiple first semiconductor layers comprise the at least one other layer of the multiple layers.

15. The method of claim 14, wherein the multiple first semiconductor materials layers comprise silicon.

16. The method of claim 11, wherein at least one second semiconductor material layer of the multiple second semiconductor material layers has a greater thickness than at least one first semiconductor material layer of the multiple first semiconductor material layers.

17. The method of claim 16, wherein providing the alignment mask spacer comprises conformally wrapping the alignment mask spacer around exposed portions of the multiple first semiconductor material layers of the multiple, alternating first and second semiconductor material layers.

18. The method of claim 1, wherein the cut mask spacer comprises an oxide spacer, and the alignment mask spacer comprises a nitride spacer.

19. The method of claim 1, wherein the sidewall spacer comprises one of a nitride spacer or a low-k dielectric constant spacer.

20. The method of claim 1, wherein the substrate structure comprises an insulating layer disposed over a substrate, the multiple layers and the gate structure being disposed above the insulating layer.

* * * * *